(12) United States Patent
Akiyama

(10) Patent No.: US 12,356,752 B2
(45) Date of Patent: Jul. 8, 2025

(54) LIGHT-RECEIVING DEVICE

(71) Applicant: SONY SEMICONDUCTOR SOLUTIONS CORPORATION, Kanagawa (JP)

(72) Inventor: Kentaro Akiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 470 days.

(21) Appl. No.: 17/758,087

(22) PCT Filed: Dec. 24, 2020

(86) PCT No.: PCT/JP2020/048438
§ 371 (c)(1),
(2) Date: Jun. 28, 2022

(87) PCT Pub. No.: WO2021/140936
PCT Pub. Date: Jul. 15, 2021

(65) Prior Publication Data
US 2023/0048188 A1    Feb. 16, 2023

(30) Foreign Application Priority Data

Jan. 6, 2020    (JP) ................................. 2020-000191

(51) Int. Cl.
*H10F 39/00* (2025.01)
*H01L 23/544* (2006.01)

(52) U.S. Cl.
CPC ......... *H10F 39/809* (2025.01); *H01L 23/544* (2013.01); *H10F 39/026* (2025.01); *H10F 39/811* (2025.01); *H01L 2223/54426* (2013.01)

(58) Field of Classification Search
CPC ...... H10F 39/80; H10F 39/809; H10F 39/811; H01L 23/544
See application file for complete search history.

(56) References Cited

U.S. PATENT DOCUMENTS

| | | | |
|---|---|---|---|
| 2006/0197007 A1 | 9/2006 | Iwabuchi et al. | |
| 2013/0009039 A1 | 1/2013 | Sato et al. | |
| 2014/0077386 A1* | 3/2014 | Kuang | H01L 23/544 |
| | | | 257/774 |

(Continued)

FOREIGN PATENT DOCUMENTS

| | | |
|---|---|---|
| CN | 1838423 A | 9/2006 |
| CN | 102867835 A | 1/2013 |

(Continued)

OTHER PUBLICATIONS

International Search Report and Written Opinion of PCT Application No. PCT/JP2020/048438, issued on Mar. 30, 2021, 09 pages of ISRWO.

*Primary Examiner* — Peter M Albrecht
(74) *Attorney, Agent, or Firm* — CHIP LAW GROUP

(57) ABSTRACT

A light-receiving device includes: a first chip having a pixel region in which a sensor pixel is provided; a second chip including a processing circuit that performs signal processing on a sensor signal outputted from the sensor pixel, the second chip being stacked on the first chip; and a first alignment mark provided in the pixel region of the first chip to correspond to a second alignment mark provided in the second chip.

14 Claims, 14 Drawing Sheets

(56) References Cited

U.S. PATENT DOCUMENTS

2015/0348914 A1    12/2015   Takazawa et al.
2020/0258924 A1    8/2020   Takachi et al.

FOREIGN PATENT DOCUMENTS

| | | |
|---|---|---|
| CN | 104981907 A | 10/2015 |
| CN | 111247638 A | 6/2020 |
| EP | 2958146 A1 | 12/2015 |
| JP | 2007-013089 A | 1/2007 |
| JP | 2013-016676 A | 1/2013 |
| JP | 2014-157885 A | 8/2014 |
| JP | 2017-103347 A | 6/2017 |
| KR | 10-2006-0096924 A | 9/2006 |
| KR | 10-2020-0077522 A | 6/2020 |
| TW | 200701447 A | 1/2007 |
| TW | 201924035 A | 6/2019 |
| WO | 2014/125969 A1 | 8/2014 |
| WO | 2019/087764 A1 | 5/2019 |

\* cited by examiner

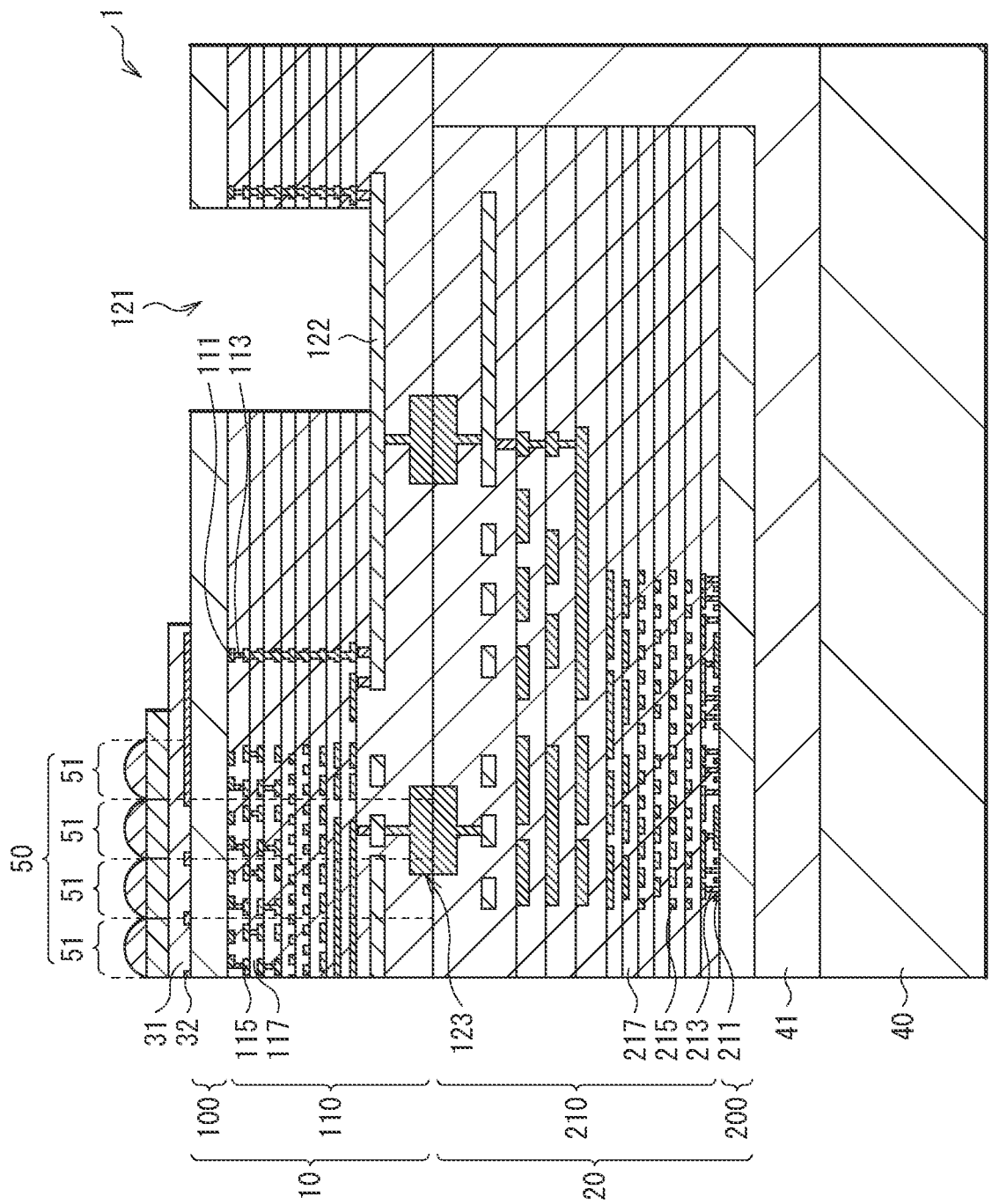
[FIG. 1]

[FIG. 2]
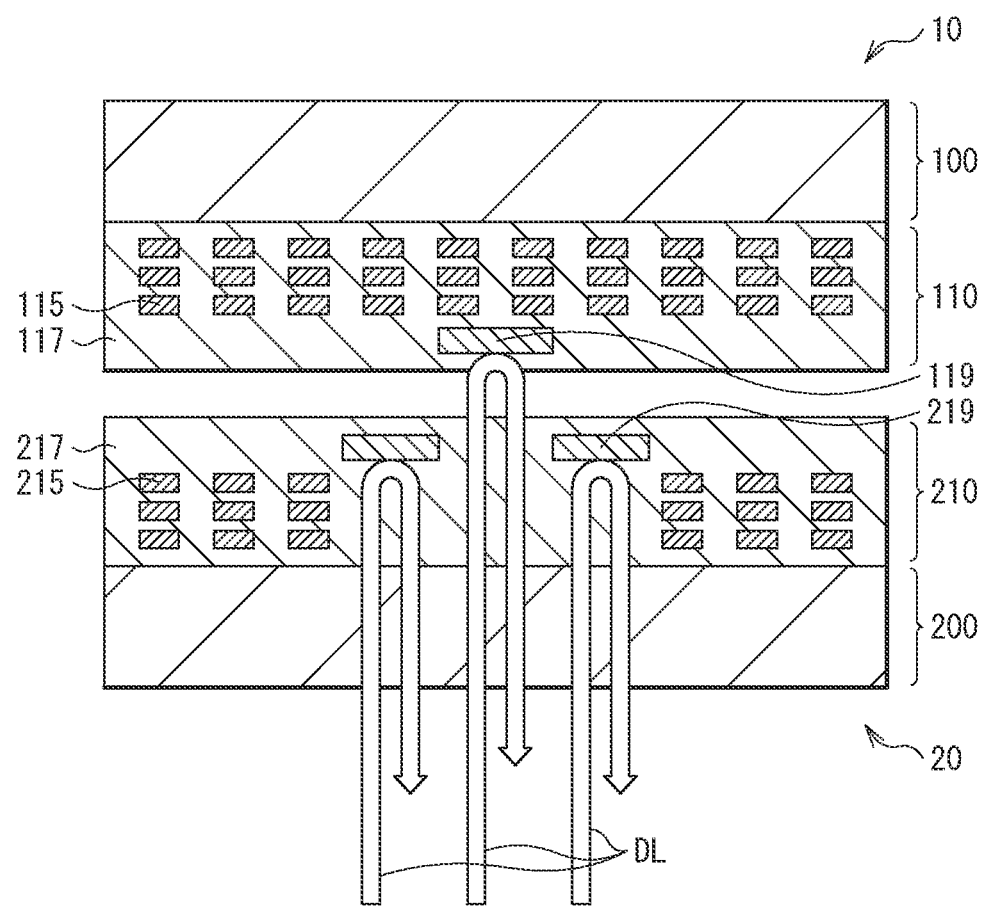

[ FIG. 3A ]
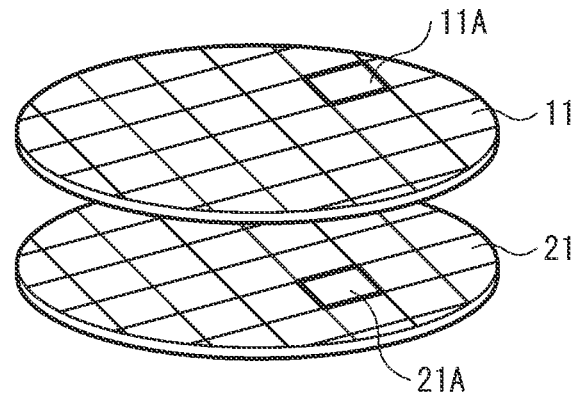
[ FIG. 3B ]
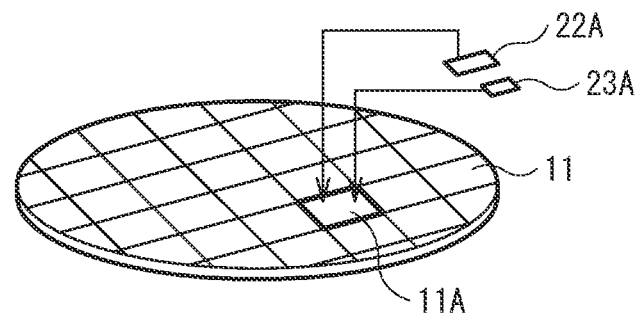
[ FIG. 4 ]
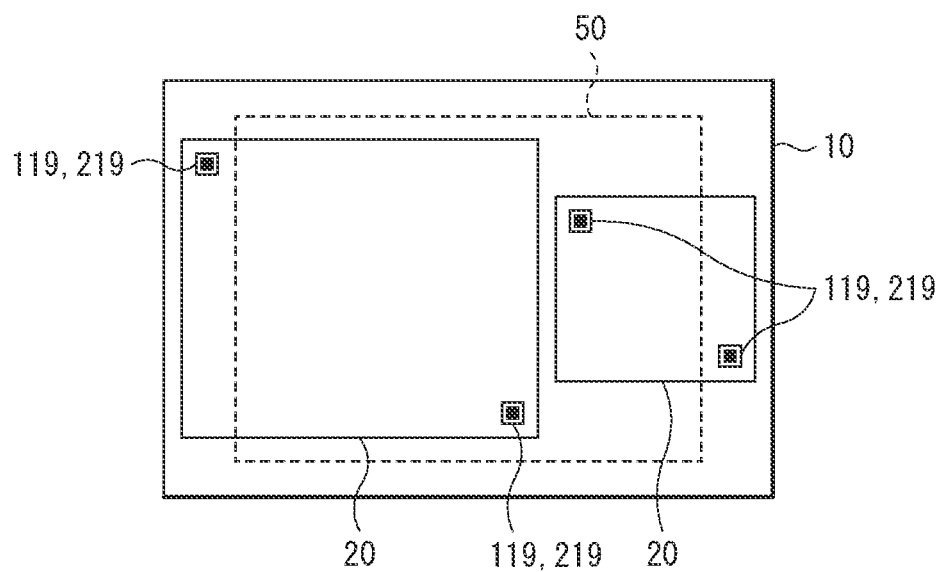

[ FIG. 5A ]
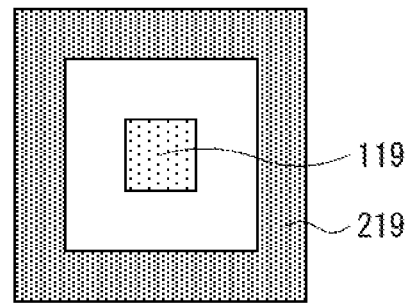
[ FIG. 5B ]
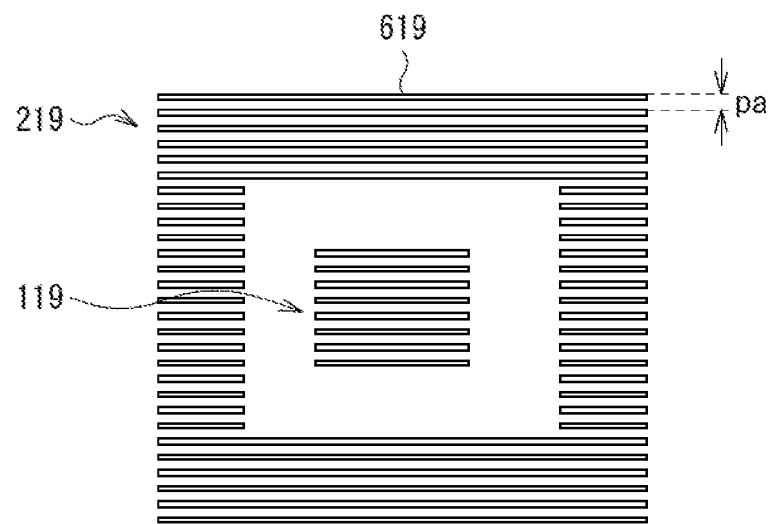

[ FIG. 6A ]
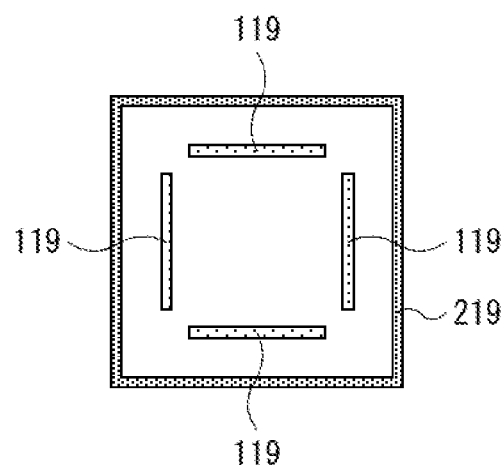
[ FIG. 6B ]
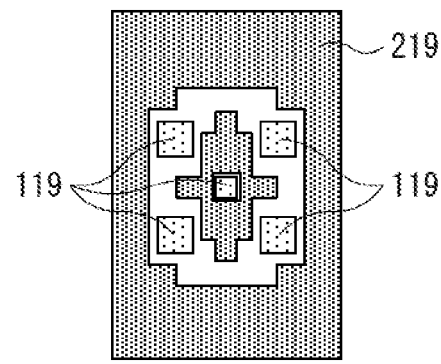
[ FIG. 6C ]
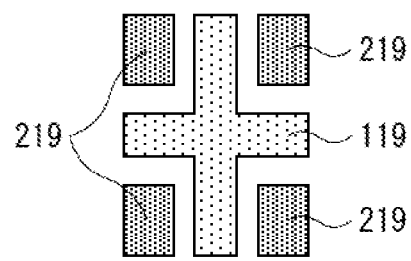

[FIG. 7]
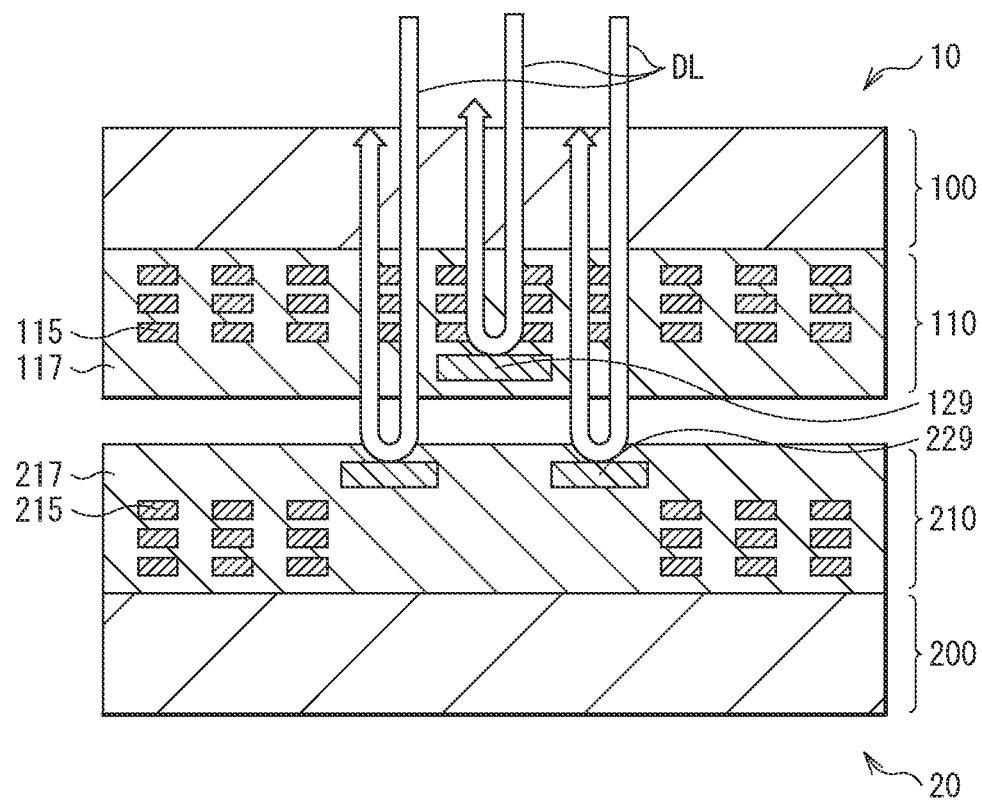

[FIG. 8]
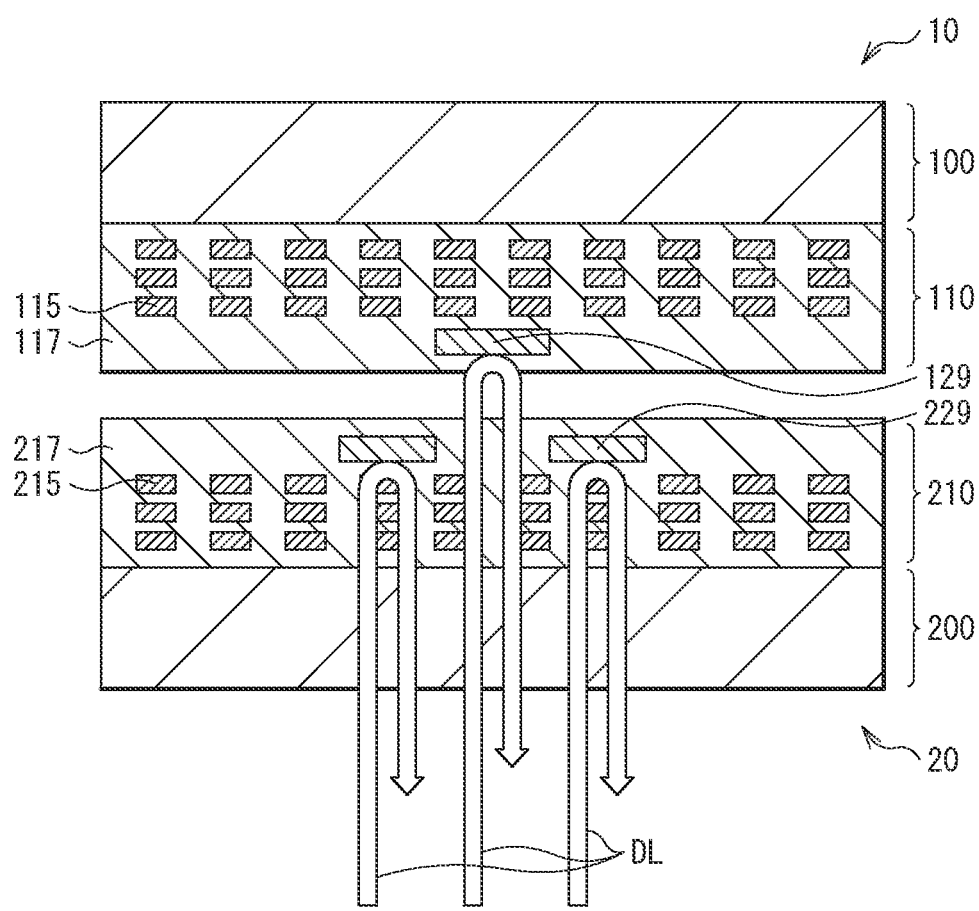

[FIG. 9]
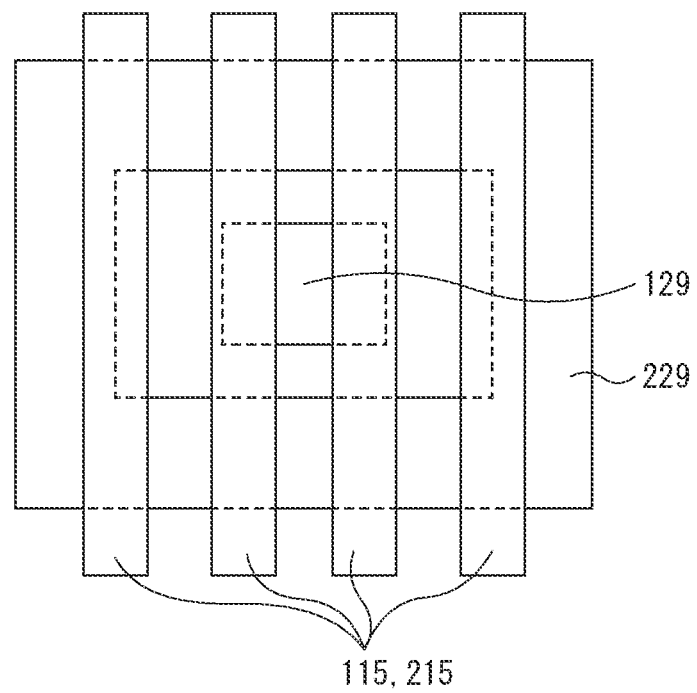

[FIG. 10]
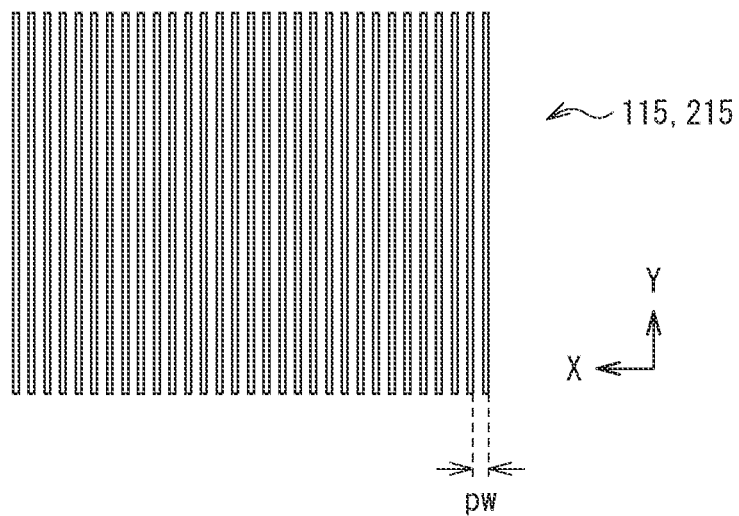
[FIG. 11]
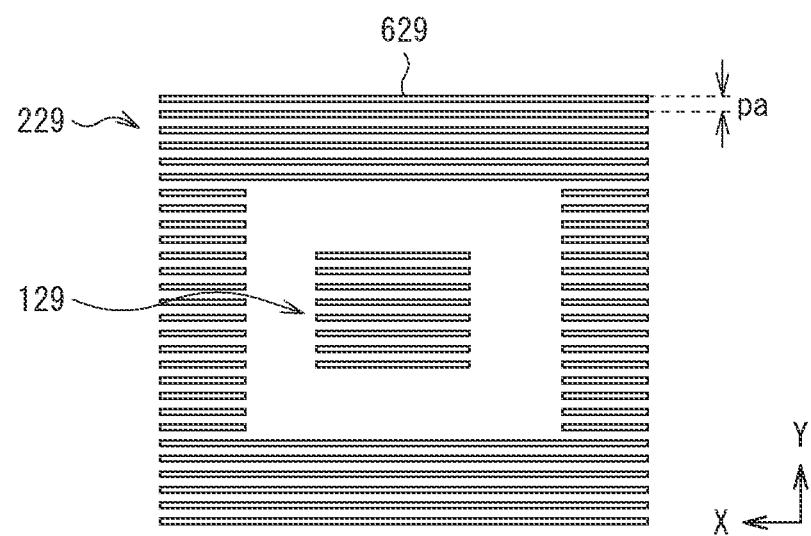

[FIG. 12]
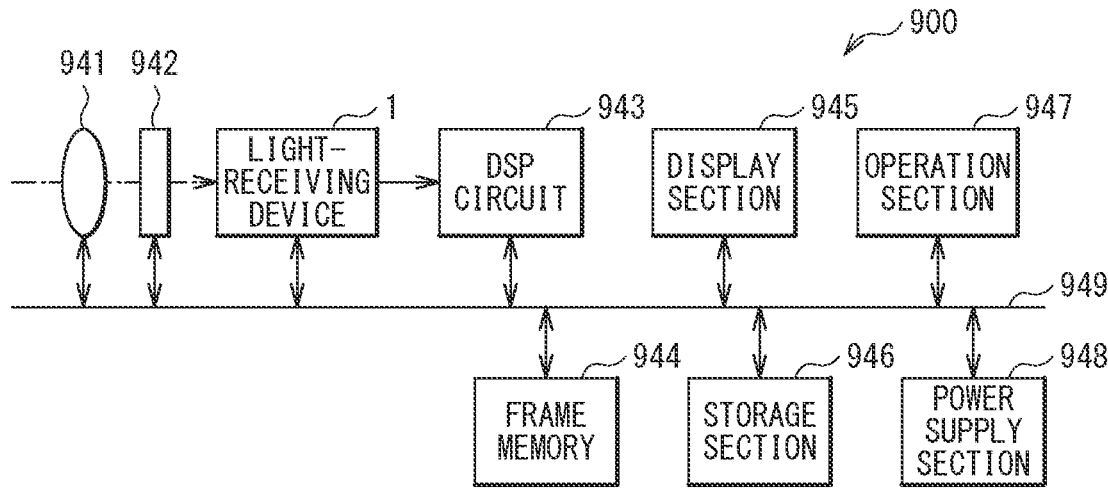
[FIG. 13]
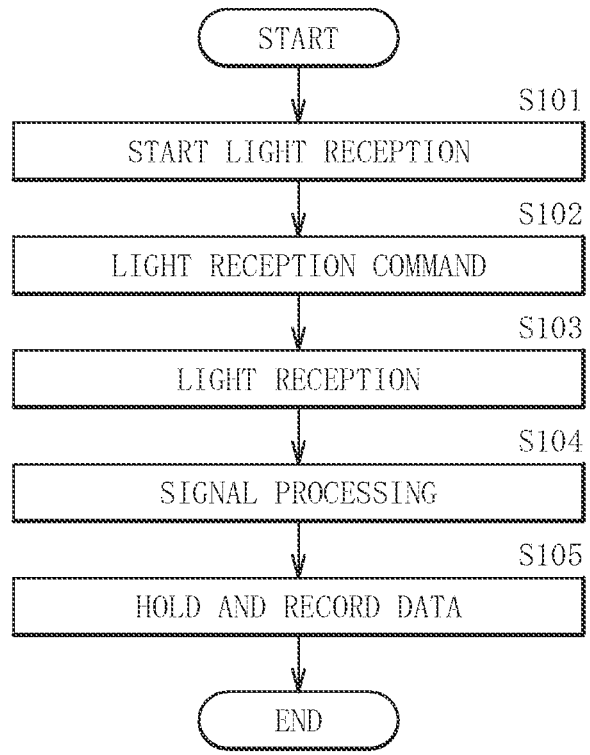

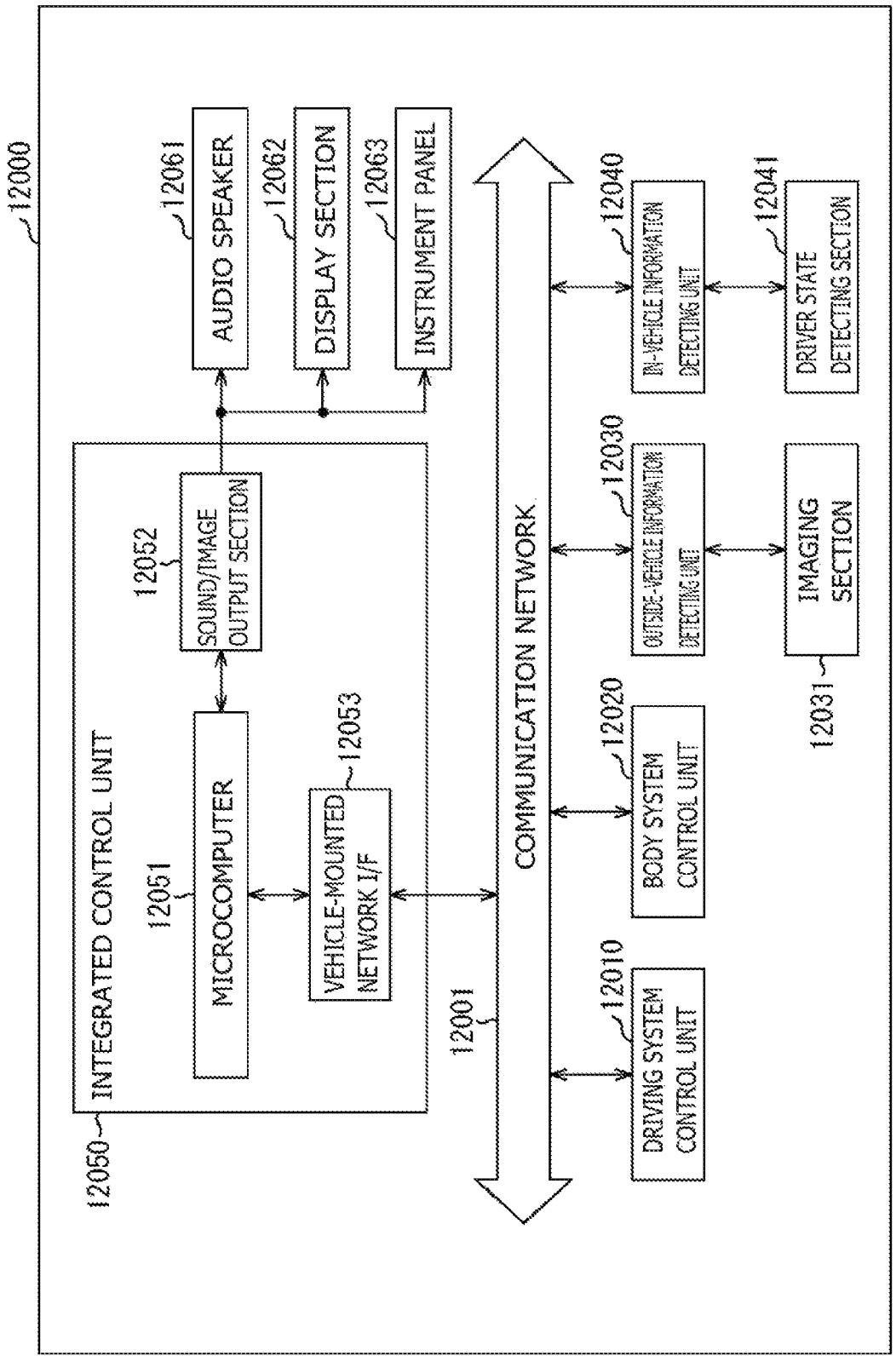

[FIG. 15]
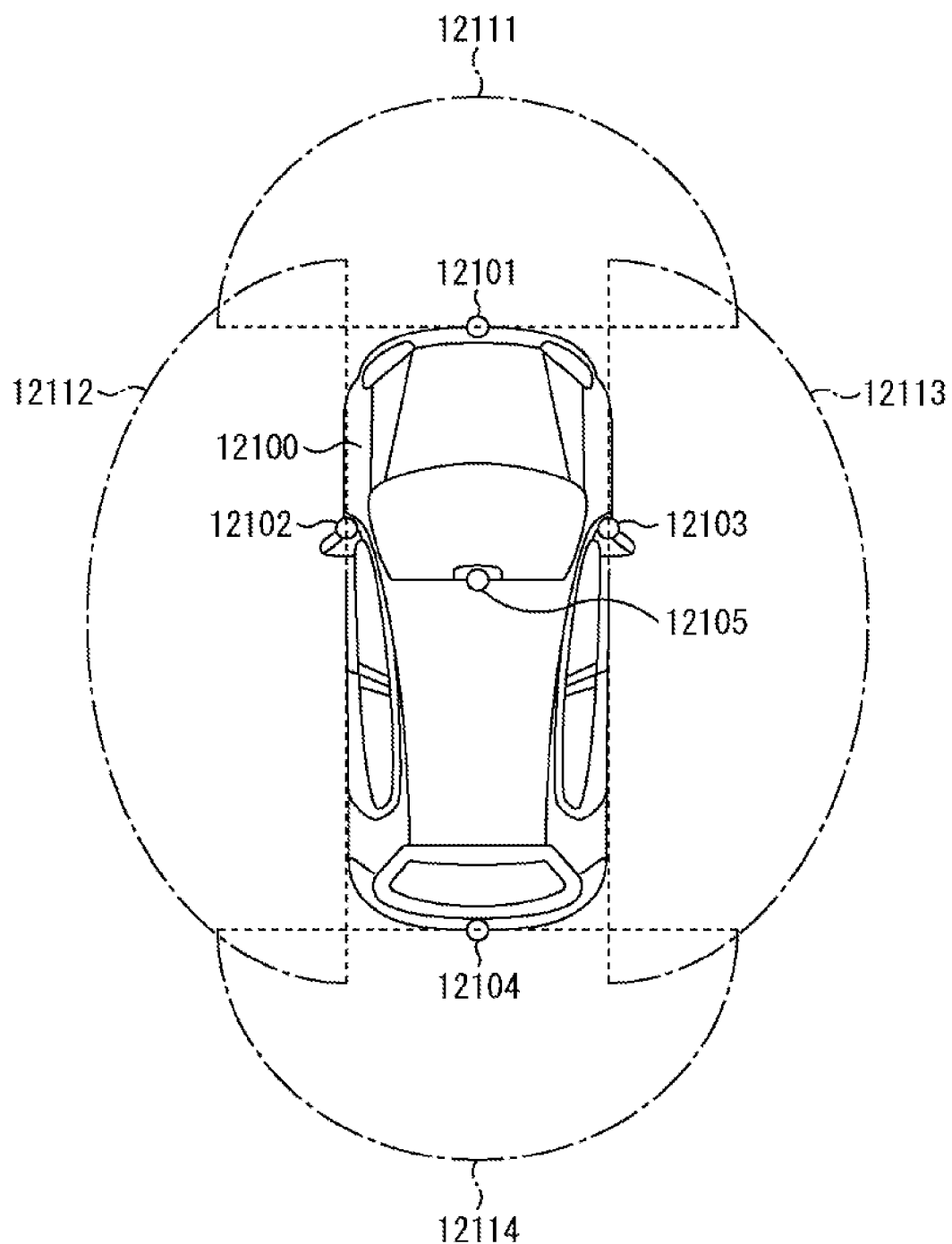

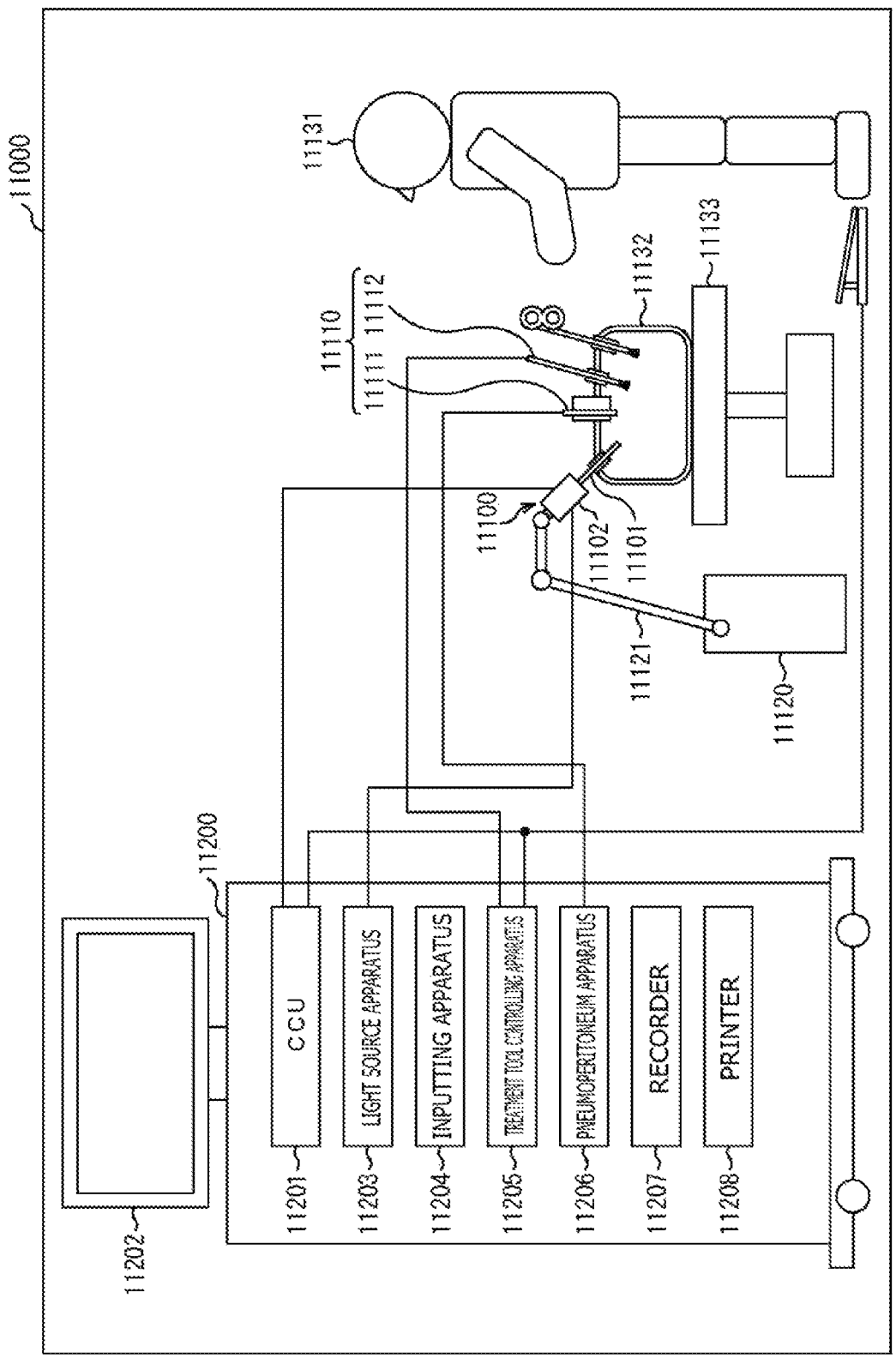
[FIG. 16]

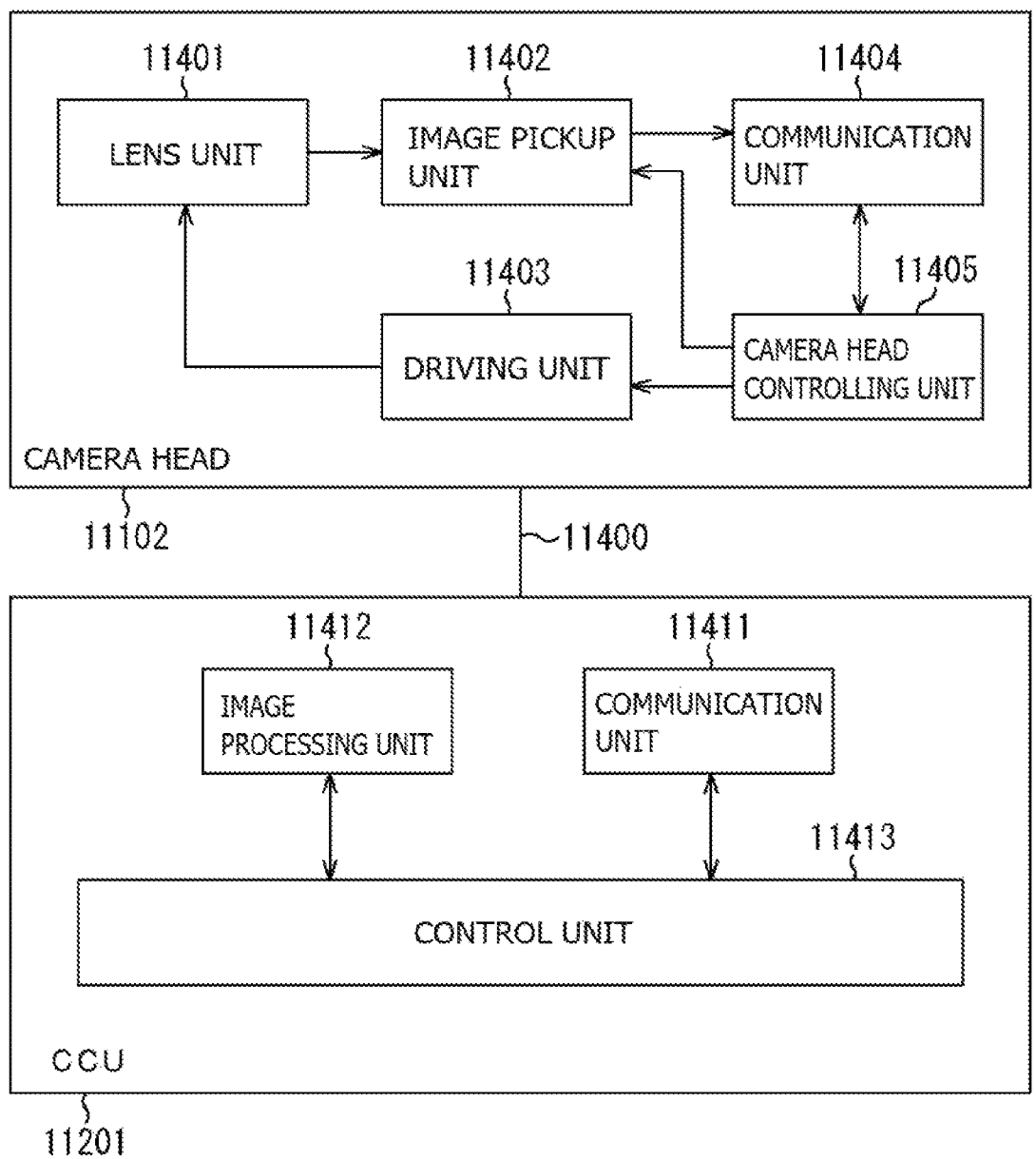
[FIG. 17]

LIGHT-RECEIVING DEVICE

CROSS REFERENCE TO RELATED APPLICATIONS

This application is a U.S. National Phase of International Patent Application No. PCT/JP2020/048438 filed on Dec. 24, 2020, which claims priority benefit of Japanese Patent Application No. JP 2020-000191 filed in the Japan Patent Office on Jan. 6, 2020. Each of the above-referenced applications is hereby incorporated herein by reference in its entirety.

TECHNICAL FIELD

The present disclosure relates to a light-receiving device.

BACKGROUND ART

In recent years, as a technology for further downsizing the configuration of a light-receiving device such as an imaging device, a technology has been proposed in which a pixel array, and a signal processing circuit or a memory circuit are formed on different chips, and are bonded together in a chip state (see PTL 1).

Alignment between the chips for bonding is performed by detecting alignment marks provided for alignment on respective chips. Accordingly, positions of the respective chips are controlled to cause the alignment marks provided on the respective chips to have a predetermined positional relationship, thus making it possible to control a positional relationship between the chips with high accuracy.

CITATION LIST

Patent Literature

PTL 1: International Publication No. WO2019/087764

SUMMARY OF THE INVENTION

As described above, in such a stacked-type light-receiving device, it is desired to further downsize the light-receiving device. Accordingly, it is desired that alignment marks for alignment that do not contribute to a function of the light-receiving device be provided in efficient placement not to increase the size of the light-receiving device.

It is therefore desirable to provide a light-receiving device in which alignment marks are provided in more efficient placement.

A light-receiving device according to an embodiment of the present disclosure includes: a first chip having a pixel region in which a sensor pixel is provided; a second chip including a processing circuit that performs signal processing on a sensor signal outputted from the sensor pixel, the second chip being stacked on the first chip; and a first alignment mark provided in the pixel region of the first chip to correspond to a second alignment mark provided in the second chip.

In the light-receiving device according to the embodiment of the present disclosure, the first chip having the pixel region in which the sensor pixel is provided, and the second chip including the processing circuit that performs signal processing on the sensor signal outputted from the sensor pixel are aligned and stacked with use of the first alignment mark provided in the pixel region of the first chip and the second alignment mark provided in the second chip. This makes it possible for the light-receiving device to provide, for example, alignment marks for alignment used for stacking chips in more efficient placement.

BRIEF DESCRIPTION OF THE DRAWINGS

FIG. 1 is a vertical cross-sectional view of an entire configuration of a light-receiving device to which the technology according to the present disclosure is applied.

FIG. 2 is a vertical cross-sectional view that describes an overview of a first alignment mark and a second alignment mark according to a first embodiment of the present disclosure.

FIG. 3A is a schematic perspective view of a specific example of a first chip and a second chip that are bonded together.

FIG. 3B is a schematic perspective view of a specific example of the first chip and the second chip that are bonded together.

FIG. 4 is a plan view of an example of placement of the first alignment mark and the second alignment mark in the first chip and the second chip.

FIG. 5A is a schematic view of a configuration example of the first alignment mark and the second alignment mark according to the same embodiment.

FIG. 5B is a schematic view of a configuration example of the first alignment mark and the second alignment mark according to the same embodiment.

FIG. 6A is a schematic view that describes variations of planar shapes of the first alignment mark and the second alignment mark according to the same embodiment.

FIG. 6B is a schematic view that describes variations of planar shapes of the first alignment mark and the second alignment mark according to the same embodiment.

FIG. 6C is a schematic view that describes variations of planar shapes of the first alignment mark and the second alignment mark according to the same embodiment.

FIG. 7 is a vertical cross-sectional view that describes an overview of a first alignment mark and a second alignment mark according to a second embodiment of the present disclosure.

FIG. 8 is a vertical cross-sectional view that describes the overview of the first alignment mark and the second alignment mark according to the same embodiment.

FIG. 9 is a schematic view of a configuration example of the first alignment mark and the second alignment mark according to the same embodiment, which are superimposed on wiring layers.

FIG. 10 is a schematic view of a configuration example of wiring layers according to a modification example of the same embodiment.

FIG. 11 is a schematic view of a configuration example of a first alignment mark and a second alignment mark according to the modification example of the same embodiment.

FIG. 12 is a block diagram illustrating an example of a schematic configuration of an imaging system including a light-receiving device according to an embodiment of the present disclosure.

FIG. 13 is a flowchart diagram illustrating a flow of an imaging operation in the imaging system.

FIG. 14 is a block diagram depicting an example of schematic configuration of a vehicle control system.

FIG. 15 is a diagram of assistance in explaining an example of installation positions of an outside-vehicle information detecting section and an imaging section.

FIG. 16 is a view depicting an example of a schematic configuration of an endoscopic surgery system.

FIG. 17 is a block diagram depicting an example of a functional configuration of a camera head and a camera control unit (CCU).

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, and the like of respective components illustrated in the respective drawings.

It is to be noted that description is given in the following order.

1. First Embodiment
   1.1. Configuration Example of Light-receiving Device
   1.2. Configuration Example of Alignment Marks
   1.3. Variations of Shapes of Alignment Marks
2. Second Embodiment
   2.1. Configuration Example of Alignment Marks
   2.2. Modification Example
3. Application Examples

1. First Embodiment

1.1. Configuration Example of Light-Receiving Device

First, description is given of an entire configuration of a light-receiving device 1 to which the technology according to the present disclosure is applied with reference to FIG. 1. FIG. 1 is a vertical cross-sectional view of the entire configuration of the light-receiving device 1.

As illustrated in FIG. 1, the light-receiving device 1 is, for example, a back-illuminated type CMOS (Complementary Metal-Oxide-Semiconductor) image sensor. The light-receiving device 1 includes, for example, a stacked structure of a first chip 10 and a second chip 20.

It is to be noted that in this specification, the term "chip" includes both a wafer on which a plurality of semiconductor devices is formed, and a piece (chip) into which the wafer is cut for each semiconductor device. That is, the light-receiving device 1 may be a light-receiving device in which a wafer and a wafer, a wafer and a chip, or a chip and a chip are stacked.

The first chip 10 has a photoelectric conversion function, and outputs a sensor signal based on an amount of received light. Specifically, the first chip 10 has a pixel region 50 in which a plurality of sensor pixels 51 are two-dimensionally arranged in a matrix form. The first chip 10 performs photoelectric conversion of received light in each of the sensor pixels 51, and outputs a sensor signal based on electric charge generated by the photoelectric conversion to the second chip 20.

The first chip 10 is provided by stacking a multilayer wiring layer 110 on a semiconductor substrate 100. The multilayer wiring layer 110 is opposed to a multilayer wiring layer 210 of the second chip 20 to stack the first chip 10 on the second chip 20. In the first chip 10, a main surface on side opposite to a main surface opposed to the second chip 20 serves as a light reception surface.

The semiconductor substrate 100 is, for example, a substrate including a semiconductor such as Si (silicon). The semiconductor substrate 100 is provided with a photodiode (PhotoDiode: PD) for each of the sensor pixels 51.

The multilayer wiring layer 110 includes, for example, an electrode 111, a contact 113, a wiring layer 115, and an interlayer insulating film 117.

The electrode 111 is provided on the semiconductor substrate 100, and functions as an electrode of a transistor or the like. The electrode 111 may include, for example, polysilicon. The contact 113 is provided to penetrate through the interlayer insulating film 117 in a film thickness direction, and electrically couples the electrode 111, and the wiring layer 115 or the like to each other. The contact 113 may include, for example, a metal such as W (tungsten), Ti (titanium) or Ta (tantalum), or a compound of any of these metals. The interlayer insulating film 117 electrically separates the electrode 111, the contact 113, the wiring layer 115, and the like from each other. The interlayer insulating film 117 may include, for example, $SiO_2$ (silicon dioxide), SiN (silicon nitride), or the like. The wiring layer 115 outputs electric charge taken from the photodiode provided for each of the sensor pixels 51, and a sensor signal based on the electric charge to a processing circuit or the like. The wiring layer 115 may include, for example, a metal such Cu (copper) or Al (aluminum).

In addition, the first chip 10 is provided with a coupling hole 121. The coupling hole 121 is provided to penetrate through a portion of the multilayer wiring layer 110 and the semiconductor substrate 100, and exposes a pad electrode 122 provided in the multilayer wiring layer 110. The pad electrode 122 includes, for example, Al (aluminum) or the like, and functions as an external coupling terminal that performs input and output of signals from and to outside.

The second chip 20 includes a processing circuit that performs signal processing on the sensor signal outputted from the first chip 10. Specifically, the second chip 20 is provided with a plurality of MOSFETs (Metal-Oxide-Semiconductor Field Effect Transistors). The second chip 20 performs signal processing on the sensor signal outputted from the first chip 10 with use of the processing circuit including a plurality of MOSFETs.

In order to enhance a theoretical yield in the number of chips formable from one wafer, the second chip 20 including the processing circuit that performs signal processing on the sensor signal is provided smaller. In contrast, in the first chip 10, the size of the pixel region 50 including the sensor pixels 51 that receive incident light is designed on the basis of optical specifications. For this reason, a plane area of the second chip 20 may be smaller than a plane area of the first chip 10.

The second chip 20 is provided by stacking the multilayer wiring layer 210 on a semiconductor substrate 200. The multilayer wiring layer 210 is opposed to the multilayer wiring layer 110 of the first chip 10 to stack the second chip 20 on the first chip 10.

The multilayer wiring layer 210 includes, for example, an electrode 211, a contact 213, a wiring layer 215, and an interlayer insulating film 217.

The electrode 211 is provided on the semiconductor substrate 200, and functions as an electrode of a plurality of MOSFETs. The electrode 211 may include, for example, polysilicon. The contact 213 is provided to penetrate through the interlayer insulating film 217 in the film thickness direction, and electrically couples the electrode 211, and the wiring layer 215 or the like to each other. The contact 213 may include, for example, a metal such as W (tungsten), Ti (titanium), or Ta (tantalum), or a compound of any of these metals. The interlayer insulating film 217 electrically separates the electrode 211, the contact 213, the wiring layer 215, and the like from each other. The interlayer insulating film 217 may include, for example, SiO$_2$ (silicon dioxide), SiN (silicon nitride), or the like. The wiring layer 215 electrically couples the plurality of MOSFETs included in the processing circuit, which performs signal processing on a sensor signal, to each other. The wiring layer 215 may include, for example, a metal such as Cu (copper) or Al (aluminum).

The first chip 10 and the second chip 20 may be electrically coupled to each other by a metal bonding structure 123 such as Cu—Cu bonding. The metal bonding structure 123 is formed by bring metal electrodes exposed on respective surfaces opposed each other of the multilayer wiring layer 110 and the multilayer wiring layer 210 into contact with each other and then bonding the metal electrodes together by heat treatment or the like. It is to be noted that the first chip 10 and the second chip 20 may be electrically coupled to each other by a through electrode provided between the multilayer wiring layer 110 and the multilayer wiring layer 210.

The main surface (that is, the light reception surface), on side opposite to the main surface stacked on the second chip 20, of the first chip 10 is provided with, for example, a protective layer 31, an inter-pixel separation film 32, color filters 33, and on-chip lenses 34.

The protective layer 31 is provided on side of the light reception surface of the semiconductor substrate 100 of the first chip 10, and protects the semiconductor substrate 100 provided with the photodiodes from an external environment. The protective layer 31 may include, for example, SiO$_2$ (silicon dioxide), SiN (silicon nitride), or the like.

The inter-pixel separation film 32 is provided on side of the light reception surface of the semiconductor substrate 100 of the first chip 10 to suppress crosstalk between the sensor pixels 51. Specifically, the inter-pixel separation film 32 may be provided between the respective sensor pixels 51 with use of a light-shielding material such as W (tungsten).

Each of the color filters 33 is, for example, a red (R) filter, a green (G) filter, a blue (B) filter, or a white filter (W). The color filters 33 are provided for respective sensor pixels 51 in a regular arrangement such as a Bayer arrangement, for example. Accordingly, the light-receiving device 1 is able to obtain sensor signals in each of the sensor pixels 51 for respective colors corresponding to the color arrangement of the color filters 33.

The on-chip lenses 34 are provided for the respective sensor pixels 51 on side of the light reception surface of the first chip 10. The on-chip lenses 34 each condense incident light onto the photodiode provided for each of the sensor pixels 51. The shape of the on-chip lens 34 may be appropriately designed corresponding to the size of the sensor pixel 51. The on-chip lenses 34 may include, for example, a transparent organic resin such as an acrylic resin, or SiO$_2$ (silicon dioxide).

A main surface, on side opposite to a main surface stacked on the first chip 10, of the second chip 20 is provided with, for example, an embedding insulating layer 41 and a supporting substrate 40.

The embedding insulating layer 41 is provided on the main surface, on side opposite to the main surface stacked on the first chip 10, of the second chip 20 to embed the second chip 20. The second chip 20 is embedded in the embedding insulating layer 41, thus making it possible to protect the second chip 20 from an external environment. In addition, the second chip 20 having a smaller plane area than that of the first chip 10 is embedded in the embedding insulating layer 41, thus making it possible to planarize the main surface, on side opposite to the main surface stacked on the first chip 10, of the second chip 20. The embedding insulating layer 41 may include, for example, an organic resin, or an inorganic insulator such as SiO$_2$ (silicon dioxide) or SiN (silicon nitride).

The supporting substrate 40 is provided on a main surface, on side opposite to a main surface stacked on the second chip 20, of the embedding insulating layer 41. The supporting substrate 40 supports a stacked body of the first chip 10 and the second chip 20 to maintain rigidity and strength of the entire light-receiving device 1. The supporting substrate 40 may be, for example, a resin substrate, a glass substrate, a quartz substrate, a silicon substrate, or the like.

1.2. Configuration Example of Alignment Marks

Next, description is given of a configuration example of alignment marks provided in the light-receiving device 1 according to the first embodiment with reference to FIGS. 2, 3A, 3B, and 4. FIG. 2 is a vertical cross-sectional view that describes an overview of a first alignment mark 119 and a second alignment mark 219 according to the first embodiment. FIGS. 3A and 3B are schematic perspective view of a specific example of the first chip 10 and the second chip 20 that are bonded together. FIG. 4 is a plan view of an example of placement of the first alignment mark 119 and the second alignment mark 219 in the first chip 10 and the second chip 20.

As described above, the light-receiving device 1 includes, for example, a stacked structure of the first chip 10 and the second chip 20. Accordingly, a process of manufacturing the light-receiving device 1 includes a process of bonding the first chip 10 and the second chip 20 together. In the step of bonding the first chip 10 and the second chip 20 together, in order to align the positions of the wiring layer 115 and the wiring layer 215 in respective chips, or the position of the metal bonding structure 123, it is important to control bonding positions of the first chip 10 and the second chip 20 with high accuracy.

Accordingly, as illustrated in FIG. 2, in the light-receiving device 1, an alignment mark for alignment is provided in each of the first chip 10 and the second chip 20. Specifically, the first alignment mark 119 is provided in the multilayer wiring layer 110 of the first chip 10, and the second alignment mark 219 is provided in the multilayer wiring layer 210 of the second chip 20. In the process of bonding the first chip 10 and the second chip 20 together, detecting the first alignment mark 119 and the second alignment mark 219 with use of detection light DL makes it possible to control a planar positional relationship between the first chip 10 and the second chip 20. For example, detection of the first alignment mark 119 and the second alignment mark 219 is performed by detecting reflected light of the detection light DL by the first alignment mark 119 and the second alignment mark 219.

The first alignment mark 119 and the second alignment mark 219 may include, for example, a metal material such as Al (aluminum). In order to further improve alignment accuracy, the first alignment mark 119 and the second alignment mark 219 may be respectively provided on bonding surface side of the multilayer wiring layer 110 and the multilayer wiring layer 210.

In the light-receiving device 1 according to the present embodiment, providing the first alignment mark 119 inside the pixel region 50 of the first chip 10 makes it possible to use a chip area of the first chip 10 more efficiently. In addition, in the light-receiving device 1 according to the present embodiment, it is possible to control the bonding position of the second chip 20 with respect to the first chip 10 more flexibly.

For example, as illustrated in FIG. 3A, for example, in a case where a first wafer 11 (corresponding to the first chip 10) on which a plurality of semiconductor devices 11A is formed and a second wafer 21 (corresponding to the second chip 20) on which a plurality of semiconductor devices 21A is formed are bonded together, the first alignment mark 119 and the second alignment mark 219 are respectively provided on the first wafer 11 and the second wafer 21. Accordingly, after the first wafer 11 and the second wafer 21 are cut into pieces to form stacked bodies each including the semiconductor device 11A and the semiconductor device 21A, the first alignment mark 119 and the second alignment mark 219 do not remain in each of the stacked bodies each including the semiconductor device 11A and the semiconductor device 21A.

In contrast, as illustrated in FIG. 3B, for example, in a case where diced semiconductor devices 22A and 23A (corresponding to the second chip 20) are bonded to the semiconductor device 11A (corresponding to the first chip 10) formed on the first wafer 11, the first alignment marks 119 and the second alignment marks 219 are respectively formed on the semiconductor device 11A and the semiconductor devices 22A and 23A. Accordingly, even after the first wafer 11 is cut into pieces to form stacked bodies each including the semiconductor device 11A and the semiconductor devices 22A and 23A, the first alignment marks 119 and the second alignment marks 219 remain in each of the stacked bodies each including the semiconductor device 11A and the semiconductor devices 22A and 23A.

Here, in a case where the first alignment mark 119 is not provided inside the pixel region 50 of the semiconductor device 11A (corresponding to the first chip 10), a region for the first alignment mark 119 is separately provided in the semiconductor device 11A. In such a case, the size of the semiconductor device 11A becomes larger. In addition, in a case where the first alignment mark 119 is not provided inside the pixel region 50 of the semiconductor device 11A, the semiconductor device 11A is different in size from the diced semiconductor devices 22A and 23A (corresponding to the second chip 20), which causes a possibility that the bonding position of the second chip 20 with respect to the first chip 10 does not become appropriate.

In the light-receiving device 1 according to the present embodiment, providing the first alignment mark 119 inside the pixel region 50 of the first chip 10 makes it possible to dispose the first alignment mark 119 and the second alignment mark 219 more efficiently. Accordingly, in the light-receiving device 1, it is possible to change the bonding position of the second chip 20 with respect to the first chip 10, and the size of the second chip 20 more flexibly. In addition, in the light-receiving device 1, it is possible to bond a plurality of second chips 20 that include processing circuits having different functions at appropriate positions of the first chip 10 for respective functions.

It is to be noted that in the light-receiving device 1 illustrated in FIGS. 1 and 2, a photodiode is provided for each of the sensor pixels 51 in the pixel region 50 of the first chip 10. Accordingly, in order to detect the first alignment mark 119 and the second alignment mark 219 with higher accuracy, the detection light DL may enter from side of the semiconductor substrate 200 of the second chip 20, for example. In addition, in such a case, in order not to unintentionally reflect or scatter the detection light DL, it is preferable that the wiring layer 215 and elements such as a transistor not be provided in the multilayer wiring layer 210 and the semiconductor substrate 200 in a region where the first alignment mark 119 and the second alignment mark 219 are provided.

For example, as illustrated in FIG. 4, in a case where two second chips 20 having different functions are bonded to the first chip 10, for example, at least two or more first alignment marks 119 and at least two or more second alignment marks 219 may be provided in the first chip 10 and the second chip 20. In such a case, one or more of the two or more first alignment marks 119 and one or more of the two or more second alignment marks 219 are provided inside the pixel region 50. Thus, according to the light-receiving device 1 according to the present embodiment, it is possible to provide the first alignment marks 119 and the second alignment marks 219 at a plurality of locations, which makes it possible to further enhance accuracy of alignment between the first chip 10 and the second chip 20.

It is to be noted that in a case where each of planar shapes of the first chip 10 and the second chip 20 is a rectangular shape, the first alignment marks 119 and the second alignment marks 219 may be provided at at least two corner sections present at diagonal corners of the rectangular shape of the second chip 20. In such a case, the first alignment marks 119 and the second alignment marks 219 makes it possible to efficiently enhance accuracy of alignment between the first chip 10 and the second chip 20 at fewer locations.

In addition, in a case where each of the planar shapes of the first chip 10 and the second chip 20 is a rectangular shape, the first alignment marks 119 and the second alignment marks 219 may be provided at at least four corner sections of the rectangular shape of the second chip 20. In such a case, the first alignment marks 119 and the second alignment marks 219 makes it possible to further enhance accuracy of alignment between the first chip 10 and the second chip 20.

Next, description is given of specific planar shapes of the first alignment mark 119 and the second alignment mark 219 with reference to FIGS. 5A and 5B. FIGS. 5A and 5B are schematic views of a configuration example of the first alignment mark 119 and the second alignment mark 219. It is to be noted that FIGS. 5A and 5B illustrate planar shapes of the first alignment mark 119 and the second alignment mark 219 in plan view from a stacking direction of the light-receiving device 1.

The planar shapes of the first alignment mark 119 and the second alignment mark 219 may have shapes corresponding to each other for alignment on a plane as illustrated in FIG. 5A. Specifically, the first alignment mark 119 may have a rectangular shape, and the second alignment mark 219 may have a rectangular frame shape surrounding a periphery of the first alignment mark 119.

According to such planar shapes, the first alignment mark 119 and the second alignment mark 219 are able to measure intervals therebetween in two directions orthogonal to each other (an up-down direction and a right-left direction in FIG. 5A). Accordingly, controlling the intervals between the first alignment mark 119 and the second alignment mark 219 in the two directions orthogonal to each other (that is, the up-down direction and the right-left direction) at predetermined values makes it possible for the first chip 10 and the second chip 20 to have a predetermined positional relationship.

It is to be noted that the planar shapes of the first alignment mark 119 and the second alignment mark 219 are exchangeable. That is, the second alignment mark 219 may have a rectangular shape, and the first alignment mark 119 may have a rectangular frame shape surrounding a periphery of the second alignment mark 219.

In addition, as illustrated in FIG. 5B, the first alignment mark 119 and the second alignment mark 219 may have planar shapes configured by arranging a plurality of conductor layers 619 extending in parallel in the same direction.

The plurality of conductor layers 619 extending in parallel in the same direction configure a so-called wire grid; therefore, the conductor layers 619 are able to function as a polarizer. Specifically, the conductor layers 619 are able to reflect linearly polarized light vibrating in a direction parallel to an extending direction, and allow linearly polarized light vibrating in a direction orthogonal to the extending direction to pass therethrough. Accordingly, using the linearly polarized light vibrating in the direction parallel to the extending direction of the conductor layers 619 as the detection light DL makes it possible for the first alignment mark 119 and the second alignment mark 219 each including a plurality of conductor layers 619 to reflect the detection light DL, as in a case where the first alignment mark 119 and the second alignment mark 219 each are formed using a single film (that is, a solid film) of a metal material such as Al (aluminum).

The first alignment mark 119 and the second alignment mark 219 each include a plurality of conductor layers 619, which makes it possible to decrease pattern density. This makes it possible for the light-receiving device 1 to suppress reflection of light by the first alignment mark 119 and the second alignment mark 219. Thus, it is possible for the light-receiving device 1 to suppress an increase in background noise in the sensor pixels 51 in a region where the first alignment mark 119 and the second alignment mark 219 are provided.

In order to further reduce an influence of the first alignment mark 119 and the second alignment mark 219 on the sensor pixels 51, a repetitive pitch pa with which the conductor layers 619 are provided is preferably equal to or less than the size of the sensor pixel 51. For example, the repetitive pitch pa with which the conductor layers 619 are provided is preferably equal to or less than 5 µm. It is to be noted that the repetitive pitch pa with which the conductor layers 619 are provided may be uniform or may be nonuniform.

Here, the size of the sensor pixel 51 means a size (a length of one side) of a minimum repetitive pattern of a pixel that is able to read electric charge obtained by photoelectric conversion in a photodiode. For example, in a case where the minimum repetitive pattern of the sensor pixel 51 is a square shape, the size of the sensor pixel 51 may be a length of one side of the square shape. In addition, in a case where the minimum repetitive pattern of the sensor pixel 51 is a rectangular shape, the size of the sensor pixel 51 may be a length of a short side of the rectangular shape.

1.3. Variations of Shapes of Alignment Marks

Next, description is given of variations of the planar shapes of the first alignment mark 119 and the second alignment mark 219 with reference to FIGS. 6A, 6B and 6C.

FIGS. 6A, 6B, and 6C are schematic views that describe variations of the planar shapes of the first alignment mark 119 and the second alignment mark 219. It is to be noted that FIGS. 6A, 6B, and 6C illustrate planar shapes of the first alignment mark 119 and the second alignment mark 219 in plan view from the stacking direction of the light-receiving device 1.

As illustrated in FIG. 6A, the first alignment mark 119 may have a shape in which vertex sections at four corners of a rectangular frame shape are eliminated and four sides are separated from one another. The second alignment mark 219 may have a frame shape surrounding the periphery of the first alignment mark 119. According to such planar shapes, the first alignment mark 119 and the second alignment mark 219 are able to measure intervals therebetween in two directions orthogonal to each other (an up-down direction and a right-left direction in FIG. 6A) at sides of their frame shapes.

As illustrated in FIG. 6B, the first alignment mark 119 may have five rectangular shapes disposed at positions corresponding to respective vertices and the center of a square. The second alignment mark 219 may have a polygonal shape that contains the rectangular shape at the center of the first alignment mark 119 and spreads in a cross shape between four rectangular shapes of the first alignment mark 119, and a frame shape surrounding peripheries of the four rectangular shapes of the first alignment mark 119. According to such planar shapes, the first alignment mark 119 and the second alignment mark 219 are able to measure intervals therebetween in the two directions orthogonal to each other (an up-down direction and a right-left direction in FIG. 6B) between the five rectangular shapes of the first alignment mark 119 and the polygonal shape or the frame shape of the second alignment mark 219.

As illustrated in FIG. 6C, the first alignment mark 119 may have a cross shape including two straight lines orthogonal to each other. The second alignment mark 219 may have four rectangular shapes disposed at positions between which the two straight lines included in the cross shape of the first alignment mark 119 are sandwiched. According to such planar shapes, the first alignment mark 119 and the second alignment mark 219 are able to measure intervals therebetween in two directions orthogonal to each other (an up-down direction and a right-left direction in FIG. 6C) between the cross shape and the four rectangular shapes.

Accordingly, even in the planar shapes illustrated in FIGS. 6A, 6B, and 6C, it is possible to control intervals between the first alignment mark 119 and the second alignment mark 219 in two directions orthogonal to each other (that is, the up-down direction and the right-left direction) at predetermined values, which makes it possible for the first chip 10 and the second chip 20 to have a predetermined positional relationship.

The first alignment mark 119 and the second alignment mark 219 illustrated in FIGS. 6A, 6B, and 6C may be also configured using a plurality of conductor layers 619 extending in parallel in the same direction, as with FIG. 5B. In addition, even in FIGS. 6A, 6B, and 6C, the planar shapes of the first alignment mark 119 and the second alignment mark 219 are exchangeable.

2. Second Embodiment (2.1. Configuration Example of Alignment Marks)

Next, description is given of a configuration example of alignment marks provided in the light-receiving device 1 according to a second embodiment with reference to FIGS. 7 to 9. FIGS. 7 and 8 are vertical cross-sectional views that describe an overview of a first alignment mark 129 and a second alignment mark 229 according to the second embodiment. FIG. 9 is a schematic view of a configuration example of the first alignment mark 129 and the second alignment mark 229 that are superimposed on wiring layers 115. It is to be noted that FIG. 9 illustrates planar shapes of the first alignment mark 129 and the second alignment mark 229 in plan view from the stacking direction of the light-receiving device 1.

In the light-receiving device 1 illustrated in FIGS. 7 and 8, the first alignment mark 129 is provided inside the pixel region 50 of the first chip 10; therefore, a photodiode and the wiring layer 115 are provided in the first chip 10 (that is, the multilayer wiring layer 110 and the semiconductor substrate 100) in a region where the first alignment mark 129 and the second alignment mark 229 are provided.

In addition, in order to use the chip area in the second chip 20 more efficiently, it is desirable that the wiring layer 215 and elements such as a transistor be provided in the second chip 20 (that is, the multilayer wiring layer 210 and the semiconductor substrate 200) in a region where the first alignment mark 119 and the second alignment mark 219 are provided, similarly to a region other than the region.

Furthermore, in a case where the semiconductor substrates 100 and 200 are thinned by polishing or the like, a region where the wiring layers 115 and 215 are not provided has lower strength, which causes polishing to easily progress. Accordingly, in a case where a region where the wiring layers 115 and 215 are provided and a region where the wiring layers 115 and 215 are not provided are mixed, thinning the semiconductor substrates 100 and 200 while maintaining flatness increases difficulty in process. Accordingly, it is desirable to provide the wiring layer 215 and elements such as a transistor in the second chip 20 in the region where the first alignment mark 119 and the second alignment mark 219 are provided, similarly to a region other than the region.

For this reason, in the second embodiment, it is desirable that the detection light DL pass through the wiring layer 115 (FIG. 7) provided in the multilayer wiring layer 110 or the wiring layer 215 (FIG. 8) provided in the multilayer wiring layer 210, and be reflected by the first alignment mark 129 and the second alignment mark 229.

Accordingly, in the second embodiment, as illustrated in FIG. 9, the wiring layers 115 and 215 in a region where the first alignment mark 129 and the second alignment mark 229 are provided to extend in parallel in the same direction. The wiring layers 115 and 215 may include, for example, a metal such as Cu (copper) or Al (aluminum).

A plurality of wiring layers 115 and 215 extending in parallel in the same direction configures a so-called wire grid, therefore, the wiring layers 115 and 215 are able to function as a polarizer. Specifically, such wiring layers 115 and 215 are able to reflect linearly polarized light vibrating in a direction perpendicular to the extending direction, and allows linearly polarized light vibrating in a direction orthogonal to the extending direction to pass therethrough. Accordingly, using linearly polarized light vibrating in the direction parallel to the extending direction of the wiring layers 115 and 215 as the detection light DL makes it possible for the detection light DL to pass through the wiring layers 115 and 215 and be reflected by the first alignment mark 129 and the second alignment mark 229 that exist on inner side in an irradiation direction.

An arrangement pitch of the plurality of wiring layers 115 and 215 extending in parallel in the same direction may be appropriately selected in accordance with a wavelength of light used for the detection light DL. Specifically, the arrangement pitch of the wiring layers 115 and 215 may be selected to allow the detection light DL that is linearly polarized light vibrating in a direction perpendicular to the extending direction of the wiring layers 115 and 215 to pass through the wiring layers 115 and 215 more efficiently.

As with the first embodiment, the planar shapes of the first alignment mark 129 and the second alignment mark 229 have shapes corresponding to each other for alignment on a plane. Specifically, the first alignment mark 129 may have a rectangular shape, and the second alignment mark 229 may have a rectangular frame shape surrounding a periphery of the first alignment mark 129. The materials and configurations of the first alignment mark 129 and the second alignment mark 229 are substantially similar to those in the first embodiment, and are not described in detail here.

It is to be noted that the planar shapes of the first alignment mark 129 and the second alignment mark 229 are exchangeable. That is, the second alignment mark 229 may have a rectangular shape, and the first alignment mark 129 may have a rectangular frame shape surrounding a periphery of the second alignment mark 229.

2.2. Modification Example

Next, description is given of a modification example of the second embodiment with reference to FIGS. 10 and 11. FIG. 10 is a schematic view of a configuration example of the wiring layers 115 and 215 according to the modification example of the second embodiment. FIG. 11 is a schematic view of a configuration example of the first alignment mark 129 and the second alignment mark 229.

As illustrated in FIGS. 10 and 11, in the modification example of the second embodiment, the first alignment mark 129 and the second alignment mark 229, and the wiring layers 115 and the wiring layers 215 in a region where the first alignment mark 129 and the second alignment mark 229 are provided may be provided in wire grid structures extending in directions orthogonal to each other.

Specifically, as illustrated in FIG. 10, the wiring layers 115 and the wiring layers 215 provided in the multilayer wiring layers 110 and 210 may be provided as wiring lines extending in parallel to each other in a first direction (a Y direction in FIG. 10). In addition, as illustrated in FIG. 11, the first alignment mark 129 and the second alignment mark 229 may have planar shapes configured by arranging a plurality of conductor layers 629 extending in parallel in a second direction (X direction in FIG. 11) orthogonal to the first direction.

According to the configuration described above, the wiring layers 115 and the wiring layers 215, and the first alignment mark 129 and the second alignment mark 229 are able to function as polarizers. Accordingly, the wiring layers 115 and the wiring layers 215 are able to reflect linearly polarized light vibrating in the Y direction, and allow linearly polarized light vibrating in the X direction to pass therethrough. In addition, the first alignment mark 129 and the second alignment mark 229 are able to reflect the linearly polarized light vibrating in the X direction, and allow the linearly polarized light vibrating in the Y direction to pass therethrough.

Accordingly, the linearly polarized light vibrating in the X direction is used for the detection light DL of the first alignment mark 129 and the second alignment mark 229, which allows the detection light DL to be reflected by the first alignment mark 129 and the second alignment mark 229 while passing through the wiring layers 115 and the wiring layers 215. Accordingly, in the light-receiving device 1 according to the modification example of the second embodiment, the detection light DL is able to detect the first alignment mark 129 and the second alignment mark 229 without being reflected or scattered by the wiring layers 115 and the wiring layers 215 that are provided to be superimposed on the first alignment mark 129 and the second alignment mark 229.

In addition, it is possible to reduce a possibility that linearly polarized light having passed through the first alignment mark 129 and the second alignment mark 229 is reflected by the wiring layers 115 or the wiring layers 215 that are provided on inner side of the first alignment mark 129 and the second alignment mark 229. Accordingly, in the light-receiving device 1 according to the modification example of the second embodiment, suppressing reflection of the detection light DL inside the light-receiving device 1 makes it possible to reduce noise in detection.

The wiring layers 115 and the wiring layers 215 may include, for example, a metal such as Cu (copper) or Al (aluminum). In term of suppressing reflection on the sensor pixel 51 by reflected light, an arrangement pitch pw of the wiring layers 115 and 215 is preferably equal to or less than the size of the sensor pixel 51, and specifically preferably equal to or less than 5 µm. In addition, in a case where near-infrared light is used as the detection light DL, in terms of further enhancing characteristics of polarizers, the arrangement pitch pw of the wiring layers 115 and 215 is preferably equal to or less than 1 µm that is the wavelength of near-infrared light.

The conductor layers 629 included in the first alignment mark 129 and the second alignment mark 229 may include, for example, a metal material such as Al (aluminum). A repetitive pitch pa of the conductor layers 629 included in the first alignment mark 129 and the second alignment mark 229 is preferably equal to or less than the size of the sensor pixel 51 in order to suppress reflection of incident light on the sensor pixel 51.

It is to be noted that as described in the first embodiment, the size of the sensor pixel 51 means a size (a length of one side) of a minimum repetitive pattern of a pixel that is able to read electric charge obtained by photoelectric conversion in a photodiode.

3. Application Examples

Description is given below of application examples of the light-receiving device according to an embodiment of the present disclosure with reference to FIGS. 12 to 17.
Application to Imaging System)

First, description is given of application of the light-receiving device 1 according to the embodiment of the present disclosure to an imaging system with reference to FIGS. 12 and 13. FIG. 12 is a block diagram illustrating a schematic configuration of an imaging system 900 including the light-receiving device 1 according to the present embodiment. FIG. 13 is a flowchart diagram illustrating a flow of an imaging operation in the imaging system 900.

As illustrated in FIG. 12, examples of the imaging system 900 include an imaging device such as a digital still camera or a video camera, a portable terminal device having an imaging function such as a smartphone or a tablet-type terminal, and the like.

The imaging system 900 includes, for example, a lens group 941, a shutter 942, the light-receiving device 1 according to the present embodiment, a DSP circuit 943, a frame memory 944, a display section 945, a storage section 946, an operation section 947, and a power supply section 948. In the imaging system 900, the light-receiving device 1, the DSP circuit 943, the frame memory 944, the display section 945, the storage section 946, the operation section 947, and the power supply section 948 are coupled to one another via a bus line 949.

The light-receiving device 1 receives incident light having passed through the lens group 941 and the shutter 942, and outputs a sensor signal (that is, image data) corresponding to the received light. The DSP circuit 943 is a signal processing circuit that processes the image data outputted from the light-receiving device 1. The frame memory 944 temporarily holds the image data processed by the DSP circuit 943 in a frame unit. The display section 945 includes, for example, a panel-type display device such as a liquid crystal panel or an organic EL (Electro Luminescence) panel, and displays the image data processed by the DSP circuit 943. The storage section 946 includes a recording medium such as a semiconductor memory or a hard disk, and records the image data outputted from the light-receiving device 1 or the image data processed by the DSP circuit 943. The operation section 947 issues an operation command for various functions of the imaging system 900 on the basis of an operation by a user. The power supply section 948 includes various types of power supplies that supply power for operation of the light-receiving device 1, the DSP circuit 943, the frame memory 944, the display section 945, the storage section 946, and the operation section 947.

Next, description is given of an operation procedure in the imaging system 900.

As illustrated in FIG. 13, a user instructs start of light reception by operating the operation section 947 (step S101). Thus, the operation section 947 transmits a light reception command to the light-receiving device 1 (step S102). The light-receiving device 1 starts light reception by a predetermined method upon receiving the light reception command (step S103).

Next, the light-receiving device 1 outputs image data corresponding to received light to the DSP circuit 943. The DSP circuit 943 performs predetermined signal processing (e.g., noise reduction processing, etc.) on the image data outputted from the light-receiving device 1 (step S104). The DSP circuit 943 causes the frame memory 944 to hold the image data having been subjected to the predetermined signal processing. Thereafter, the frame memory 944 stores the image data in the storage section 946 (step S105). In this manner, the operation of the imaging system 900 is performed.
(Application to Mobile Body Control System)

The technology (the present technology) according to the present disclosure is applicable to various products. For example, the technology according to the present disclosure may be applied to a device to be mounted to a mobile body of any kind such as an automobile, an electric vehicle, a hybrid electric vehicle, a motorcycle, a bicycle, a personal mobility, an airplane, a drone, a vessel, and a robot.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to the present disclosure may be applied. The technology according to the present disclosure may be applied to the imaging section 12031 among the configurations described above. According to the technology according to the present disclosure, it is possible to further downsize the imaging section 12031, which makes it possible to perform mounting to a mobile body more easily.

(Application to Endoscopic Surgery System)

The technology (the present technology) according to the present disclosure is applicable to various products. For example, the technology according to the present disclosure may be applied to an endoscopic surgery system.

FIG. 16 is a view depicting an example of a schematic configuration of an endoscopic surgery system to which the technology according to an embodiment of the present disclosure (present technology) can be applied.

In FIG. 16, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 17 is a block diagram depicting an example of a functional configuration of the camera head 11102 and the CCU 11201 depicted in FIG. 16.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given hereinabove of one example of the endoscopic surgery system, to which the technology according to the present disclosure may be applied. The technology according to the present disclosure may be suitably applied to the image pickup unit 11402 provided in the camera head 11102 of the endoscope 11100, among the configurations described above. According to the technology according to the present disclosure, it is possible to further downsize the image pickup unit 11402 and further downsize the camera head 11102 of the endoscope 11100. This makes it possible to reduce a load on the patient 11132.

The technology according to the present disclosure has been described above with reference to the first and second embodiments and the modification example. However, the technology according to the present disclosure is not limited to the embodiments and the like described above, and may be modified in a variety of ways.

The light-receiving device to which the technology according to the present disclosure is applied is not limited to a CMOS image sensor. The light-receiving device to which the technology according to the present disclosure is applied may be, for example, a ToF (Time of Flight) type distance measurement sensor, an infrared image sensor, or the like.

Further, not all of the components and operations described in the respective embodiments are necessary as the components and operations according to the present disclosure. For example, among components according to the respective embodiments, a component that is not described in an independent claim reciting the most generic concept of the present disclosure should be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used herein are used merely for the convenience of description and include terms that are not used to limit the configuration and the operation. For example, the terms such as "right", "left", "up", and "down" only indicate directions in the drawings being referred to. In addition, the terms "inside" and "outside" only indicate a direction toward the center of a component of interest and a direction away from the center of a component of interest, respectively. The same applies to terms similar to these and to terms with the similar purpose.

It is to be noted that the technology according to the present disclosure may have the following configurations. The technology according to the present disclosure having the following configurations makes it possible to provide, inside a pixel region, alignment marks that are used to bond chips together. This allows the light-receiving device to use areas of the chips more efficiently, which makes it possible to further reduce the size of the light-receiving device. Effects attained by the technology according to the present disclosure are not necessarily limited to the effects described herein, but may include any of the effects described in the present disclosure.

(1)
   A light-receiving device including:
      a first chip having a pixel region in which a sensor pixel is provided;

a second chip including a processing circuit that performs signal processing on a sensor signal outputted from the sensor pixel, the second chip being stacked on the first chip; and a first alignment mark provided in the pixel region of the first chip to correspond to a second alignment mark provided in the second chip.

(2)

The light-receiving device according to (1), in which the first alignment mark and the second alignment mark are respectively provided on bonding surface side of the first chip and the second chip.

(3)

The light-receiving device according to (2), in which a wiring line or a semiconductor element is provided in at least one of the first chip or the second chip on side opposite to the bonding surface side in a region superimposed on the first alignment mark or the second alignment mark.

(4)

The light-receiving device according to any one of (1) to (3), in which wiring lines provided in the first chip or the second chip in a region superimposed on the first alignment mark or the second alignment mark are provided to extend in a same direction.

(5)

The light-receiving device according to (4), in which the wiring lines extending in the same direction are provided with a repetitive pitch smaller than a pixel size of the sensor pixel.

(6)

The light-receiving device according to any one of (1) to (5), in which a planar shape of at least one of the first alignment mark or the second alignment mark is a rectangular shape.

(7)

The light-receiving device according to (6), in which at least one of the first alignment mark or the second alignment mark is configured by arranging a plurality of conductor layers extending in parallel in a same direction.

(8)

The light-receiving device according to (7), in which the conductor layers are arranged with a repetitive pitch smaller than a pixel size of the sensor pixel.

(9)

The light-receiving device according to any one of (1) to (8), in which
  wiring lines provided in a region superimposed on the first alignment mark or the second alignment mark are provided to extend in a first direction, and
  the first alignment mark and the second alignment mark are provided by arranging a plurality of conductor layers extending in parallel in a second direction orthogonal to the first direction.

(10)

The light-receiving device according to any one of (1) to (9), in which the first alignment mark and the second alignment mark are provided in a region where the first alignment mark and the second alignment mark are superimposed on each other in plan view of the pixel region.

(11)

The light-receiving device according to any one of (1) to (10), in which the first alignment mark and the second alignment mark have planar shapes corresponding to each other.

(12)

The light-receiving device according to any one of (1) to (11), in which a plane area of the second chip is smaller than a plane area of the first chip.

(13)

The light-receiving device according to any one of (1) to (12), in which
  the second chip has a rectangular shape, and
  the second alignment mark is provided at least at each of diagonal corners of the rectangular shape.

(14)

The light-receiving device according to any one of (1) to (13), in which
  each of the first chip and the second chip is provided by stacking a multilayer wiring layer on a semiconductor substrate, and
  the first chip and the second chip are stacked to cause the multilayer wiring layers of the first chip and the second chip to be opposed to each other.

This application claims the benefit of Japanese Priority Patent Application JP2020-000191 filed with the Japan Patent Office on Jan. 6, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving device comprising:
  a first chip having a pixel region in which a sensor pixel is provided;
  a second chip including a processing circuit that performs signal processing on a sensor signal outputted from the sensor pixel, the second chip being stacked on the first chip; and
  a first alignment mark provided in the pixel region of the first chip to correspond to a second alignment mark provided in the second chip.

2. The light-receiving device according to claim 1, wherein the first alignment mark and the second alignment mark are respectively provided on bonding surface side of the first chip and the second chip.

3. The light-receiving device according to claim 2, wherein a wiring line or a semiconductor element is provided in at least one of the first chip or the second chip on side opposite to the bonding surface side in a region superimposed on the first alignment mark or the second alignment mark.

4. The light-receiving device according to claim 1, wherein wiring lines provided in the first chip or the second chip in a region superimposed on the first alignment mark or the second alignment mark are provided to extend in a same direction.

5. The light-receiving device according to claim 4, wherein the wiring lines extending in the same direction are provided with a repetitive pitch smaller than a pixel size of the sensor pixel.

6. The light-receiving device according to claim 1, wherein a planar shape of at least one of the first alignment mark or the second alignment mark is a rectangular shape.

7. The light-receiving device according to claim 6, wherein at least one of the first alignment mark or the second alignment mark is configured by arranging a plurality of conductor layers extending in parallel in a same direction.

8. The light-receiving device according to claim 7, wherein the conductor layers are arranged with a repetitive pitch smaller than a pixel size of the sensor pixel.

9. The light-receiving device according to claim 1, wherein
wiring lines provided in a region superimposed on the first alignment mark or the second alignment mark are provided to extend in a first direction, and
the first alignment mark and the second alignment mark are provided by arranging a plurality of conductor layers extending in parallel in a second direction orthogonal to the first direction.

10. The light-receiving device according to claim 1, wherein the first alignment mark and the second alignment mark are provided in a region where the first alignment mark and the second alignment mark are superimposed on each other in plan view of the pixel region.

11. The light-receiving device according to claim 1, wherein the first alignment mark and the second alignment mark have planar shapes corresponding to each other.

12. The light-receiving device according to claim 1, wherein a plane area of the second chip is smaller than a plane area of the first chip.

13. The light-receiving device according to claim 1, wherein
the second chip has a rectangular shape, and
the second alignment mark is provided at least at each of diagonal corners of the rectangular shape.

14. The light-receiving device according to claim 1, wherein
each of the first chip and the second chip is provided by stacking a multilayer wiring layer on a semiconductor substrate, and
the first chip and the second chip are stacked to cause the multilayer wiring layer of the first chip and the second chip to be opposed to each other.

* * * * *